(12) United States Patent
Schwab et al.

(10) Patent No.: US 8,785,220 B2
(45) Date of Patent: Jul. 22, 2014

(54) ORGANIC ELECTROLUMINESCENT DEVICE

(75) Inventors: Holger Schwab, Aachen (DE); Herbert Friedrich Friedrich Boerner, Aachen (DE); Volker Lambert Van Elsbergen, Aachen (DE); Detlef Raasch, Roetgen (DE); Sören Hartmann, Baesweiler (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/816,266

(22) PCT Filed: Aug. 22, 2011

(86) PCT No.: PCT/IB2011/053673
§ 371 (c)(1),
(2), (4) Date: Feb. 11, 2013

(87) PCT Pub. No.: WO2012/025867
PCT Pub. Date: Mar. 1, 2012

(65) Prior Publication Data
US 2013/0143337 A1 Jun. 6, 2013

(30) Foreign Application Priority Data
Aug. 24, 2010 (EP) .................................. 10173785

(51) Int. Cl.
*H01L 21/00* (2006.01)
(52) U.S. Cl.
USPC .......................................................... 438/26
(58) Field of Classification Search
USPC ............................................... 438/26–28, 30
See application file for complete search history.

(56) References Cited

U.S. PATENT DOCUMENTS

| | | | | |
|---|---|---|---|---|
| 5,953,585 A | * | 9/1999 | Miyaguchi | 438/35 |
| 6,103,541 A | * | 8/2000 | Yang et al. | 438/26 |

(Continued)

FOREIGN PATENT DOCUMENTS

| | | |
|---|---|---|
| WO | 9903157 | 1/1999 |
| WO | 2008062942 A1 | 5/2008 |

(Continued)

*Primary Examiner* — Richard Booth
(74) *Attorney, Agent, or Firm* — Yuliyia Mathis

(57) ABSTRACT

The invention relates to OLED devices (1) operational at high voltages providing a good life time performance, which can be manufactured with reduced effort and costs. The organic electroluminescent device (1) comprising a substrate (2) carrying multiple electroluminescent layer stacks (3) connected in series each comprising a first and a second electrode (31, 33) and an organic light emitting layer stack (32) arranged between the first and second electrode (31, 33), a cover lid (4) sealed to the substrate (2) to encapsulate the electroluminescent layer stacks (3) providing a gap (5) between the electroluminescent layer stacks (3) and an inner side (41) of the cover lid (4), where the connection in series is established by connecting the first electrode (31) of at least one of the electroluminescent layer stacks (3) involved in the serial connection via a conductive bridge (6) to the second electrode (33) of another electroluminescent layer stack (3) involved in the serial connection, preferably the adjacent electroluminescent layer stack (3), where the conductive bridge (6) comprises an conductive path (62) arranged on the inner side (41) of the cover lid (4), a first electrical connection (61) connecting the first electrode (31) to the conductive path (62) and a second electrical connection (63) connecting the conductive path (62) with the second electrode (33) of the other electroluminescent layer stack (3), preferably the adjacent electroluminescent layer stack (3). The invention further relates to a method providing the organic electroluminescent device (1) with process steps leading to a reduced effort and costs.

6 Claims, 4 Drawing Sheets

(56) References Cited

U.S. PATENT DOCUMENTS

2009/0189515 A1    7/2009    Halls et al.
2010/0148665 A1    6/2010    Farquhar et al.

FOREIGN PATENT DOCUMENTS

WO    2010005301 A1    1/2010
WO    2010125494 A1    11/2010

* cited by examiner

ORGANIC ELECTROLUMINESCENT DEVICE

FIELD OF THE INVENTION

The invention relates to the field of organic electroluminescent devices comprising electroluminescent layer stacks connected in series and to a method to manufacture such OLED devices.

BACKGROUND OF THE INVENTION

Organic electroluminescent devices (or diodes) are devices, where organic molecules emit light when a driving voltage is applied to such organic electroluminescent devices (OLEDs). The OLEDs typically comprise a transparent substrate with an electroluminescent layer stack deposited on top of the substrate comprising an organic light emitting layer stack between two electrode layers, typically a transparent anode on top of the substrate and a reflective cathode on top of the organic layer stack. Since the organic molecules are sensitive to moisture and oxygen, the layer stack is encapsulated by a cover lid sealed on top of the substrate. In order to operate the OLED, driving voltages in the order of a few volts, e.g. 2-15 V are applied. Since the electroluminescent layer stack is a thin layer stack, shorts may occur between the electrodes caused by layer defects resulting from dust particles present in the manufacturing process. In case of a single diode configuration, the OLED device will fail in case of a present single short.

To improve the short resistance and to be able to operate the electroluminescent layer stack at higher voltages while keeping the applied current constant, OLED devices may comprise multiple electroluminescent layer stacks arranged beside each other on one single substrate and being connected in series. However, the preparation of pattern of multiple electroluminescent layer stacks requires a high structuring effort. The preparation of such layers stack might be performed with mask processes applying several different masks for the individual layers. Mask processes are expensive due to the preparation of the masks and the required accurate alignment of each mask. Furthermore structures of the electroluminescent layer stack are determined by the masks and cannot be changed easily on demand. Furthermore the manufacturing of the interconnections between the electrodes of the different electroluminescent layer stacks connected in series require a high manufacturing effort. There is a demand to reduce such effort.

US 2009/0189515 A1 discloses an OLED device comprising multiple electroluminescent layer stacks connected in series. The serial connection is established via a flexible interconnection sheet comprising a local conductive structure, which is laminated on top of the electroluminescent layer stack under the application of pressure or heat. The lamination of interconnects between the electroluminescent layer stacks avoids further structuring processes to establish such interconnects. However the application of pressure and heat to the electroluminescent layer stacks may have a negative effect on the lifetime of the OLED device. Furthermore such laminated sheets might not be sufficient to prevent moisture and oxygen diffusing into the electroluminescent layer stack, which also have a negative effect on the OLED device lifetime.

SUMMARY OF THE INVENTION

It is an object of the invention to provide an OLED device operational at high voltages providing a good life time performance, which can be manufactured with reduced effort and costs.

This object is achieved by an organic electroluminescent device comprising a substrate carrying multiple electroluminescent layer stacks connected in series each comprising a first and a second electrode and an organic light emitting layer stack arranged between the first and second electrode, a cover lid sealed to the substrate to encapsulate the electroluminescent layer stacks providing a gap between the electroluminescent layer stacks and an inner side of the cover lid, where the connection in series is established by connecting the first electrode of at least one of the electroluminescent layer stacks, preferably each of the electroluminescent layer stacks, involved in the serial connection via a conductive bridge to the second electrode of another electroluminescent layer stack involved in the serial connection, preferably the adjacent electroluminescent layer stack, where the conductive bridge comprises an conductive path arranged on the inner side of the cover lid, a first electrical connection connecting the first electrode to the conductive path and a second electrical connection connecting the conductive path with the second electrode of the other electroluminescent layer stack, preferably the adjacent electroluminescent layer stack.

The cover lid is made of any suitable rigid material providing a sufficient barrier against diffusion of moisture and/or oxygen into the encapsulated volume between cover lid and substrate. The cover lid is sealed on top of the substrate by applying a suitable sealing material being sufficiently gas tight, at least against moisture and oxygen, e.g. glass frit (non conductive material) or conductive sealing material (e.g. epoxy glue with conductive filler). The term "sealed on top of the substrate" denotes a tight connection between cover lid and substrate. In case of substrates with additional layers (e.g. contact pads for first and/or second electrodes) on top, the cover lid is sealed to the substrate across theses layers. The cover lid has an inner and outer side, where the inner side denotes the side of the cover lid facing towards the electroluminescent layer stacks. The outer side is correspondingly the other side of the cover lid. The shape of the cover lid is adapted to provide a gap between the inner side of the cover lid and the electroluminescent layer stacks. In other cases the gap might be filled with an inert fluid. The gap shall prevent any mechanical impact to the cover lid from the outside of the OLED device reaching the electroluminescent layers. A getter material might be arranged inside the gap, typically attached to the inner side of the cover lid. The gap between cover lid and electroluminescent layer stack could have dimensions up to a few millimeters. Typically the gap is filled with gas, e.g. dry nitrogen. Alternatively the gap might be filled with dry ambient air.

A serial connection of multiple electroluminescent layer stacks denotes an electrical chain of n electroluminescent layers (with n=2, 3, 4, 5, . . . electroluminescent layer stacks), where the first electroluminescent layer stack is connected to the second electroluminescent layer stack, which is connected to the third electroluminescent layer, which is connected to the fourth electroluminescent layer stack and so forth. The number of involved electroluminescent layer stacks may vary for different OLED devices within the scope of this invention. In an embodiment there might be more electroluminescent layer stacks present in the OLED device than connected in series. However, the serial connection is established by connecting the first electrode of one electroluminescent layer stack to the second electrode of another electroluminescent layer. There is no need that the one electroluminescent layer stack is arranged adjacent to the other electroluminescent layer stack. However, connecting adjacent electroluminescent layer stacks will simplify the electrical connection scheme. The electrical connection in series between at least one of the electroluminescent layer stacks is established by a conductive bridge between the first and second electrodes, which comprises three parts, a first and a second electrical connection reaching from the first and second electrodes to the cover lid and a conductive path arranged at the inner side of the cover lid to electrically connect the first and second electrical connections via the conductive paths of the cover lid. Preferably all electroluminescent layer stacks involved in the serial connection are connected with the conductive bridges. In the present invention, the term "conductive" always denotes an electrically conductive material or component, even if the term "electrically" is not used. The conductive path may be provided with any suitable conductive material, e.g. as metallic part of the cover lid, where the remaining cover lid is non-conductive, or as additional component attached to the inner side of the cover lid, e.g. wires welded to the cover lid etc. In an embodiment at least the inner side of the cover lid is made of an electrically insulating material and coated with a pattern of electrically conductive cover layers providing the conductive path. The term "pattern" denotes multiple areas of conductive layers beside each other and being electrically insulated against each other. Such cover lids might be made of e.g. glass or ceramic material. The cover layer as the conductive path may be arranged e.g. as a rectangular stripe with a suitable width and length to connect first and second electrical connections reaching to the inner side of the cover lid. However the shape of the conductive paths may vary and may be adapted to the particular application within the scope of this invention. As an example suitable cover layers might be aluminum layers applied to the inner side of the cover lid by printing, sputtering or evaporation. Alternatively, conductive pastes (e.g. metal paste such as silver pastes) might be deposited on top of the inner side of the cover lid, e.g. by printing or painting. In an alternative embodiment the cover lid is at least partly made of an electrically conductive material, where the inner side of the cover lid is coated with a pattern of electrically conductive cover layers providing the conductive path and where the cover layers are insulated against the cover lid by an insulating layer provided at least between the inner side of the cover lid and the electrically conductive cover layer. Such cover lids might be made of metal, which are coated at the inner side with a SiN or AlO layer as the insulating layer. The insulating layer has to be applied at least between the cover lid and the cover layer. In other embodiments the inner side of the cover layer might be fully coated with such insulating layer. The pattern of the cover layers as the conductive paths does not depend on the cover lid but depends on the pattern of the electroluminescent layer stacks and the desired sequence of electroluminescent layer stacks to be connected in series. In order to provide a serial connection of the electroluminescent layer stacks, the conductive paths have to be electrically insulated against each other, which could be achieved by a suitable patterning of the conductive paths. Such patterning could be achieved, e.g. by applying masks for the deposition of the cover layer, by printing metal pastes (e.g. silver pastes), or by applying laser metal transfer processes (locally evaporation of metal material from a metal sheet arranged above the inner side of the cover lid by a laser focused onto the metal sheet). The latter process can be varied easily and is suitable to provide conductive paths with different patterns on demand.

The first and second electrical connections might be provided by applying conductive material to suitable areas of the first and second electrodes. The deposited process of the conductive material is adapted to provide enough material to establish an electrical connection between electrodes and cover lid. The conductive material might be any suitable conductive material. Depending on the gap between cover lid and electroluminescent layer stacks, skilled people will adapt the required amount of conductive material to establish such a connection within the scope of this invention. As an example, the first and second electrical connections are established by metal pastes (e.g. silver pastes) or conductive glue printed onto the suitable structured first electrode not covered with the electroluminescent layer stack and the second electrode and onto the second electrode at any suitable location.

The organic electroluminescent device may utilize organic small molecules or polymers to produce light. Accordingly, OLEDs may be referred to as small molecule organic light emitting devices (SMOLEDs) or polymer light emitting devices (PLEDs). However, SMOLEDS are preferred because of their better light emission performance. The substrate is made of a transparent material, e.g. glass or plastic. The electroluminescent layer stack comprises at least two electrodes as anode and cathode and an organic light emitting layer stack in between, which may consist of one single layer or comprise multiple organic layers. In some embodiments, this plurality of organic layers arranged between the electrodes might be a combination of hole transport layer, electron transport layer, hole blocking layers, electron blocking layers, one or more light emitting layers, e.g. comprising a host material with embedded light emitting molecules. A large number of different electroluminescent layer stacks comprising a different number/type of layers is known to skilled people, which are able to choose a suitable electroluminescent layer stack in dependence on the desired application. Here the electrode on top of the substrate is denoted as first electrode. For typical so-called bottom emitter emitting light through the substrate, the first electrode is a transparent electrode, e.g. made of indium-tin-oxide (ITO). The other electrode is the second electrode, typically made of a reflective metal, e.g. Al. In alternative embodiments, where the light is emitted through the cover lid (so-called top emitter), both second electrode and cover lid have to be at least partly transparent. For bottom emitters, the first electrode and/or the substrate might be made of a non-transparent material. In some embodiment, there are additional layers present between the first electrode and the substrate in order to improve the light out-coupling behavior of the OLED. Additional hard layers may be deposited locally on top of the first electrode in order to enable a contacting of the second electrode from the side of the cover lid. Such hard layers have to be made of an electrically insulating material in order to avoid shorts between first and second electrode caused by the contacting of the cathode, e.g. with contacting wires or pins, form the backside (side of the cover lid). Typically the transparent electrode is the anode and the other electrode is the cathode. In bottom emitters, the transparent electrode is the first electrode. For top emitters, the transparent electrode is the second electrode. In so-called transparent emitters, electrodes as well as the cover lid and the substrate have to be transparent, where both electrodes might be either cathode or anode. Alternatively the use of first and second electrode as anodes or cathode can be inverted in bottom- top- and transparent emitter. Suitable transparent cathodes might be made of thin metal layers.

In an embodiment the first electrodes of the adjacent electroluminescent layer stacks are separated from each other by first gaps having a first width and the second electrode and the organic light emitting layer stack of the adjacent electroluminescent layer stacks are separated from each other by a second gap above the first gap with a second width larger than the first width providing non-covered contacting areas of the first electrodes. The term "above" denotes the layer sequence according to the deposition sequence. A layer above another layer is deposited later than the another layer (deposited on top of the another layer). The second width larger than the first width provides a sufficiently large non-coated area of the first electrode to apply the material for the first electrical connection. Typically widths of first and second gaps are 0.1 mm and 1.1 mm. For a reliable process to apply the first electrical connection to the first electrode a non-coated area of the first electrode should have a width of at least 1 mm, therefore the second width is about 1 mm larger than the first width. It is preferable to provide first widths of 0.05-0.5 mm, more preferably 0.1-0.02 mm. It is further preferably to provide second widths of 0.5-2 mm, more preferably 0.75-1.5 mm.

In another embodiment the non-covered contacting areas of the first electrode extend to the entire length of the edges of the first electrode facing towards the adjacent electroluminescent layer stack, preferably to be connected via the conductive bridge. This arrangement avoids the risk of shorts between adjacent electroluminescent layer stacks across the first gap.

In another embodiment the first electrical connections are established by conductive material deposited, preferably printed, on top of the non-covered contacting areas of the first electrode. The non-covered contacting areas provide a suitable contact area avoiding any voltage drops caused by remaining organic material on top of the contacting area. The first electrical connection preferably extends along the length of the non-covered contacting areas, more preferably extending along the entire length of the non-covered contacting areas. Here the first electrical connection can be applied as a line of conductive material following the shape of the non-covered contacting area to reduce or to avoid voltage drops caused by the first electrical connection. Subsequently also the shape of the conductive paths at the inner side of the cover lid has to be adapted to the shape of the first electrical connection.

In another embodiment the second electrical connections are established by conductive material deposited, preferably printed, on top of the second electrode. The location, where the second electrical connection is applied to the second electrode depends on the desired application. There is a design freedom to apply the second electrical connection at any suitable location on the second electrode. Subsequently the shape and location of the conductive paths at the inner side of the cover lid has to be adapted to the shape and location of the second electrical connection. The deposition process (e.g. printing) of the second electrical connection might be adapted to the present conductive paths at the inner side of the cover lid to match the contact areas.

In another embodiment the arrangement of the conductive paths at the inner side of the cover lid is adapted to connect electroluminescent layer stacks in a sequence adapted to the desired application. Even if the first and second electrical connections of two different OLED devices are located at the same position, the sequence of serial connection of the electroluminescent layer stacks and/or the number of electroluminescent layer stacks involve in the serial connection might be varied on demand by using cover lids with different pattern of conductive paths. In case of electroluminescent layer stacks emitting light of different colors (e.g. emitting blue, green and red light or emitting blue and yellow light), the resulting color of the light emitted from the OLED device resulting from the mixture of the light emitted from the individual electroluminescent layer stacks might by varied by involving a different number of electroluminescent layer stacks emitting light of a particular color into the serial connection. This variation can be controlled by the cover lids comprising different pattern of conductive paths, even if the electroluminescent layer stacks (shape, number, size, emitting color) and the first and second electrical connections (location, shape, size) are the same for all devices. The arrangement of conductive paths may also provide a combination of electroluminescent layer stacks connected in series and connected in parallel, if desired.

In another embodiment the conductive paths is connected to a functional component, preferably attached to the cover lid. Here, additional functionality can be integrated into the OLED device in a simple way and the introduced functionality might be varied on demand for different OLED devices by using cover lids equipped differently with such functional components. As an example, such functional components might be sensors to determine the local or overall current, brightness, temperature etc. during the operation of the OLED device. Also fuses might be integrated as functional components.

In another embodiment the cover lid comprises at least one electrical feedthrough to provide a driving voltage to at least one of the first and/or second electrodes. The contacting of one electrode, preferably of both electrode from the backside via one or more feedthroughs through the cover lid enables an extension of the cover lid to the edge of the substrate to increase the illuminating surface of the OLED device. In one embodiment, the first or second electrode is contacted via a first feedthrough connected to a power source, where the other electrode is contacted through the at least partly conductive cover lid and the conductive sealing material and the cover lid is further connected to the power source. In an alternative embodiment, both electrodes are connected via separate feedthroughs to the power source. Here the cover lid might be made of conductive or non-conductive material.

The invention further relates to a method to provide an organic electroluminescent device according to the present invention comprising the steps of provide a substrate carrying multiple electroluminescent layer stacks electrically insulated against each other comprising a first and a second electrode and an organic light emitting layer stack arranged between the first and second electrode, depositing, preferably printing, a first electrical connection on top of the first electrode and depositing, preferably printing, a second electrical connection on top of the second electrode, encapsulating the electroluminescent layer stacks with a cover lid comprising conductive paths sealed to the substrate providing a gap between the electroluminescent layer stacks and an inner side of the cover lid, and establishing a conductive bridge between the first electrode of at least one electroluminescent layer stack, preferably each of the electroluminescent layer stacks, involved in the serial connection to the second electrode of another electroluminescent layer stack involved in the serial connection, preferably the adjacent electroluminescent layer stack, by connecting the first and second electrical connections to conductive paths arranged at the inner side of the cover lid suitable for providing a serial connection of the electroluminescent layer stacks.

The substrate may comprise additional layers between electroluminescent layer stacks and substrate. The first and second electrical connection might be deposited by any suitable deposition method. In a preferred embodiment, the deposition method is printing, which allows to apply a significant amount of material in a short time and in a variable way. The conductive bridge is established after contacting the first and second electrical contacts to conductive paths at the inner side of the cover lids by sealing the cover lid on top of the substrate, eventually carrying additional layers inside the sealing area. During the sealing process, the first and second electrical connections come into contact with the conductive paths and establish a conductive bridge. Because the conductive bridge is established via the conductive paths at the inner side of the cover lid, a random pattern of connections can be realized by varying the conductive paths at the cover lid.

In an embodiment of the method the step of providing the substrate carrying multiple electroluminescent layer stacks further comprising the steps
- providing the substrate covered with a pattern of the first electrodes separated by a first gap having a first width between adjacent first electrodes to electrically insulate the first electrodes against each other,
- depositing the organic light emitting layer stack as a contiguous layer stack on top of the pattern of the first electrodes,
- depositing the second electrode as a contiguous layer on top of the organic light emitting layer stack,
- removing the second electrode and the organic light emitting layer stack above the first gap between the first electrode providing a second gap above the first gap with a second width larger than the first width in order to provide non-covered contacting areas of the first electrodes, preferably also removing any material deposited within the first gap.

The organic light emitting layer might be deposited by evaporation. However the application of contiguous layers enables the use of non vacuum processes like printing, spraying etc. The second electrode might be deposited by vacuum deposition technologies such as CVD, evaporation, sputtering etc. The deposition of contiguous layers with subsequent structuring avoids any mask deposition for applying the organic light emitting layer stack and the second electrode. The avoidance of mask processes for the deposition of these layers significantly reduces the manufacturing costs (avoided manufacturing of masks, avoided alignment effort for the masks, avoided cleaning of the masks after deposition, avoided production losses due to misaligned masks etc.). A patterning process made after deposition of these layers enables to prepare patterns of very small sizes if desired. In case of mask processes, structures are limited to dimensions >200 µm. The minimum separation between the individual electroluminescent layer stacks in our invention can be significantly smaller, only limited by the patterning technology for the first gap between adjacent first electrodes. The step of removing the material in the first and second gaps might be performed by any suitable removing step, e.g. plasma etching or mechanical removal via an adhesive tape. In a preferred embodiment the step of removing is done by laser ablation. Laser ablation is a contactless process, which could be easily adapted to different pattern of the electroluminescent layer stacks. The laser ablation process can be applied from the side of the second electrode and might be a two-step process first removing the second electrode in a first step and removing the organic light emitting layer stack in a second step. The laser parameters might be adapted differently for the first and second steps. Laser ablation is a well-known technique. People skilled in the art are able to choose the required laser parameter for removing the material as desired. Furthermore skilled people are able to adapt the laser parameter to different layer stacks. The material in the first and second gaps might be removed completely. In an alternative process, the organic light emitting material present in the first gap might be removed only partly. However there should be a gap provided between the remaining material of the organic light emitting layer stack and the adjacent first electrode in the first gap. Alternatively the remaining material of the organic light emitting layer stack might be removed by other techniques, e.g. a sticky tape. Alternatively the laser ablation process can be applied from the substrate side, where the organic light emitting layer stack and the second electrode are removed in a single step. The laser parameters might be adapted to provide a second gap with a second width larger than the first width of the first gap or a second laser ablation step from the other side is applied in order to achieve this second gap with this second width.

In another embodiment the method further comprises the step of providing the conductive paths at the cover lid in a pattern suitable to connect the electroluminescent layer stacks in series with a sequence adapted to a desired application. As an example, in case of electroluminescent layer stacks emitting light of different colors (e.g. emitting blue, green and red light or emitting blue and yellow light), the resulting color of the light emitted from the OLED device resulting from the mixture of the light emitted from the individual electroluminescent layer stacks might by varied by involving a different number of electroluminescent layer stacks emitting light of a particular color into the serial connection. This variation can be controlled by the cover lids comprising different pattern of conductive paths, even if the electroluminescent layer stacks (shape, number, size, emitting color) and the first and second electrical connections (location, shape, size) are the same for all devices. The arrangement of conductive paths may also provide a combination of electroluminescent layer stacks connected in series and connected in parallel.

In another embodiment the method further comprises the step of connecting at least one of the first or second electrodes to at least one electrical feedthrough present in the cover lid by depositing an electrical conductive material on top of at least one of the first or second electrodes to provide a driving voltage to at least one of the first or second electrodes. This step has the advantages as described previously.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
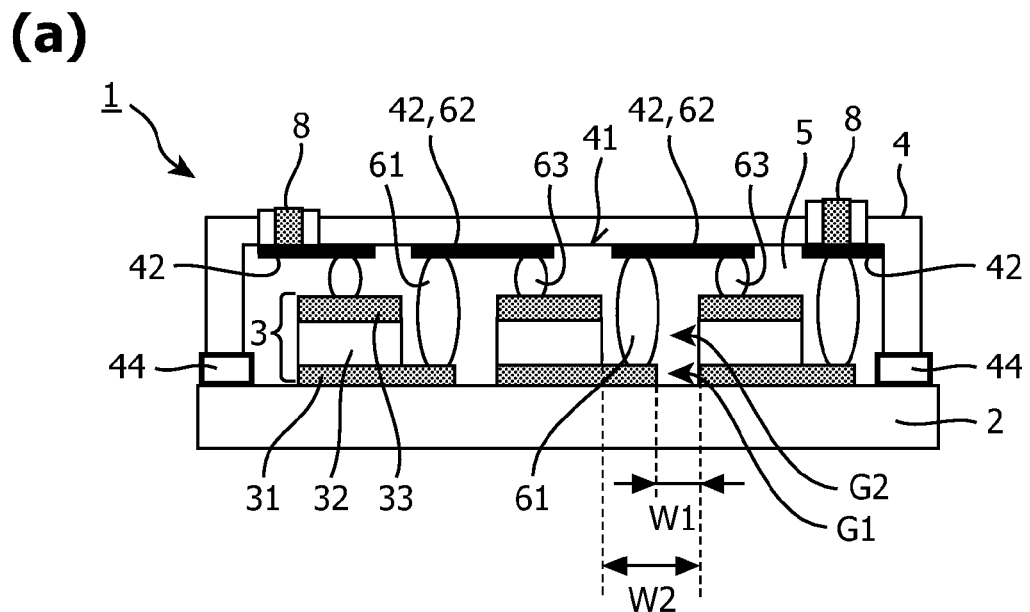
FIG. 1 shows two embodiment of the organic electroluminescent device according to the present invention, (a) with electrical feedthroughs in the cover lid, and (b) with first electrodes extending to the area of the substrate outside the area encapsulated by the cover lid.
Figure 1:
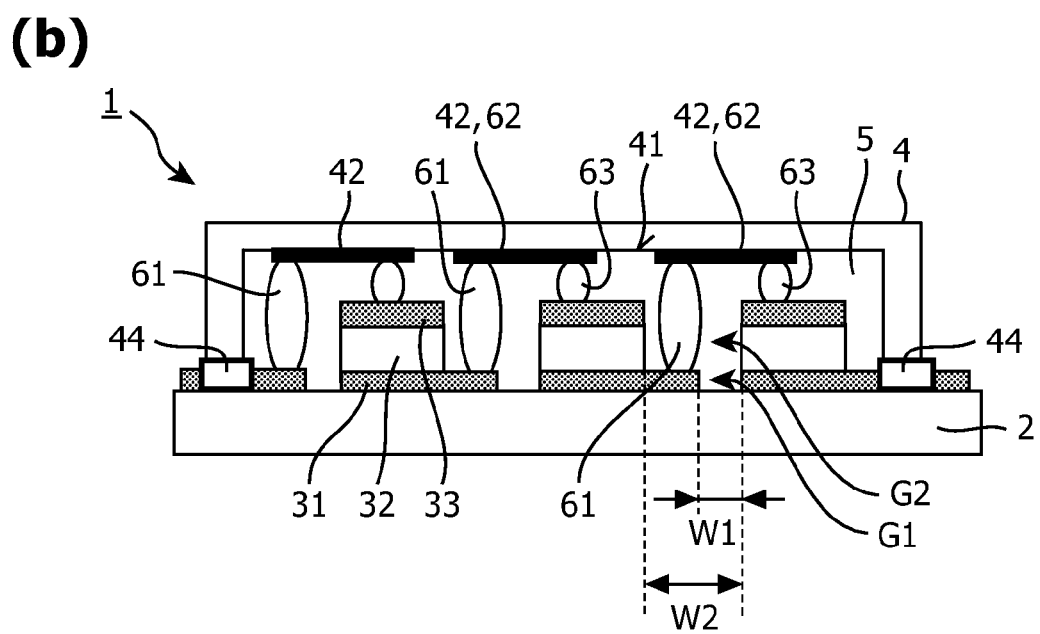

FIG. 1 shows two embodiment of the organic electroluminescent device according to the present invention, (a) with electrical feedthrough 8 in the cover lid, and (b) with first electrodes extending to the area of the substrate outside the area encapsulated by the cover lid. In both embodiments the organic electroluminescent devices 1 comprise a substrate 2 carrying multiple electroluminescent layer stacks 3, in these example three electroluminescent layer stacks 3. However the number of electroluminescent layer stacks depends on the desired application and may vary over a large range of numbers. The electroluminescent layer stacks are connected in series each comprising a first and a second electrode 31, 33 indicated as gray areas and an organic light emitting layer stack 32 arranged between the first and second electrodes 31, 33. The cover lid 4 is sealed in FIG. 1a directly to the substrate 2. In FIG. 1b, the first electrode layers extend to the outside of the cover lid, therefore the cover lid is partly sealed onto the substrate directly and partly sealed on top of the first electrodes. The sealing connection 44 may be electrically conductive or non-conductive in dependence on the applied sealing material. The cover lids 4 encapsulate the electroluminescent layer stacks 3 providing a gap 5 between the electroluminescent layer stacks 3 and an inner side 41 of the cover lid 4, where the connection in series is established by connecting the first electrode 31 of each of the electroluminescent layer stacks 3 involved in the serial connection via a conductive bridge 6 to the second electrode 33 of another electroluminescent layer stack 3 involved in the serial connection, here the adjacent electroluminescent layer stack 3, where each of the conductive bridges 6 comprises an conductive path 62 arranged on the inner side 41 of the cover lid 4, a first electrical connection 61 connecting the first electrode 31 to the conductive path 62 and a second electrical connection 63 connecting the conductive path 62 with the second electrode 33 of the other electroluminescent layer stack 3, here the adjacent electroluminescent layer stack 3. The required amount of conductive material to establish the first and second electrical connections 61, 63 differs only marginal taking into account the typical small layer thicknesses of the electroluminescent layer stack 3 in the order of one micrometer or less in comparison to the gap between the cover lid and the electroluminescent layer stacks in the order of millimeters. Therefore the first and second electrical connections 61, 63 can be deposited with the same deposition process. The first and second gaps G1, G2 and the corresponding first and second widths W1, W2 are indicated by the dashed lines. The first electrical connection 61 is connected to the first electrode 31 on the area extending into the gap G2. This area is denoted as non-covered contacting area of the first electrode, which is shown in more details in FIG. 2. In FIG. 1a the second electrode 32 is connected to the left feedthrough 8 as the first electroluminescent layer stack 3 of the serial connection of the electroluminescent layer stacks 3 and the first electrode 31 of the last electroluminescent layer stack 3 is connected to the right feedthrough 8 by applying the conductive material also used to establish the first and second electrical connections 61, 63.

Figure 2:
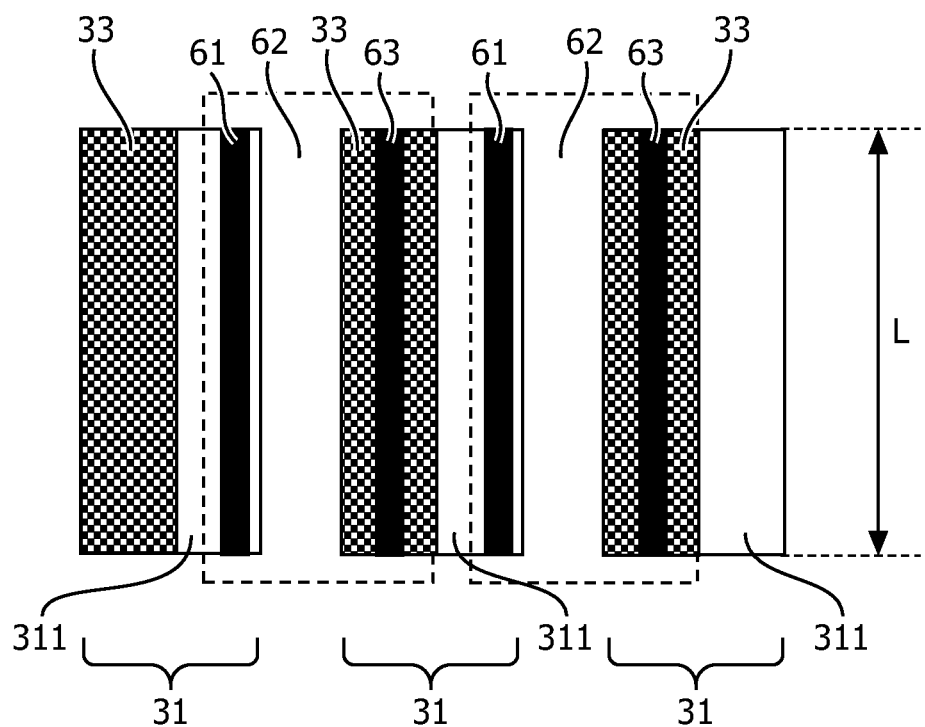
FIG. 2 shows a top view of an embodiment of the organic electroluminescent device.

FIG. 2 shows a top view of a small sector of an embodiment of the organic electroluminescent device. In this example the electroluminescent layer stacks 3 have a rectangular shape, where only the first and second electrodes 61, 63 are visible. The organic light emitting layer stack 32 is covered by the second electrode 63 and therefore not visible here. According to the shape of the electroluminescent layer stacks, also the conductive path 62 and the first and second electrical connections 61, 63 have adapted shapes. The shapes of the electroluminescent layer stacks, the first and second electrical connections 61, 63 and the conductive paths 62 may vary for other embodiments. The area of the first electrode 31 shown as white area is the non-covered contacting area 311 of the first electrode 31, where the first electrical connection 61 is applied to. The second electrical connection 63 is applied on top of the second electrode 33. Both electrical connections 61, 63 are shown as black areas. The first electrical connection 61 extends along the entire length L of the non-covered contacting areas 311 avoiding any voltage drop along the non-covered contact area 311. Also the second electrical connection 62 extends along the corresponding entire length of the second electrode 63 avoiding any voltage drop along the second electrode 63. The conductive paths 62 at the inner side of the cover lid (not shown here) are indicated as dashed areas, in this example prepared as a conductive cover layer 42. The area of the conductive paths 62 has to be adapted to at least electrically connect the first electrical connection 61 to the second electrical connection 63.

Figure 3:
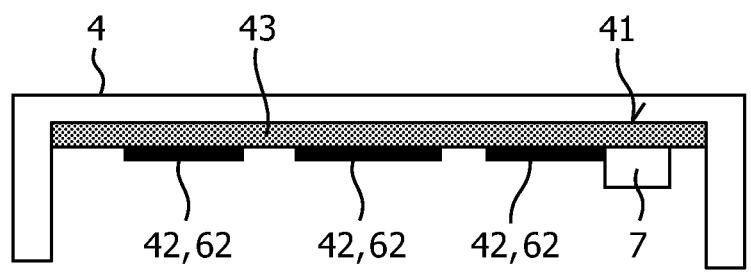
FIG. 3 shows an embodiment of a conductive cover lid additionally comprising a functional component.

FIG. 3 shows an embodiment of a conductive cover lid additionally comprising a functional component. Here one of the conductive paths 62 is connected to a functional component 7, which is arranged at the inner side 41 of the cover lid 4. In this example, the cover lid is made of conductive material, e.g. metal. To obtain a serial connection of the electroluminescent layer stacks, the conductive paths 62 have to be electrically insulated against the conductive cover lid 4. Here, the inner side 41 of the cover lid 4 is coated with a non-conducting layer 43 (e.g. SiN or AlO). The conductive paths 62 are deposited later on top of the non-conductive layer 43.

Figure 4:
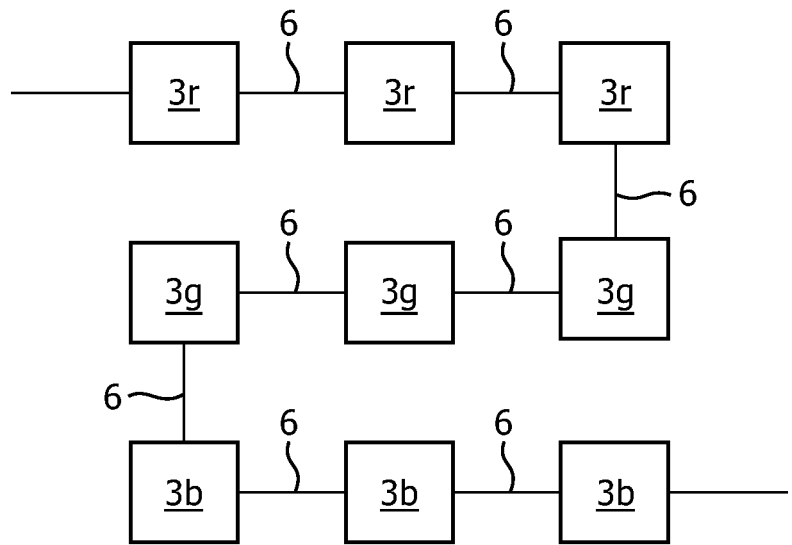
FIG. 4 shows two embodiments of multiple electroluminescent layer stacks connected in series applying different pattern of the conductive bridges.
Figure 4:
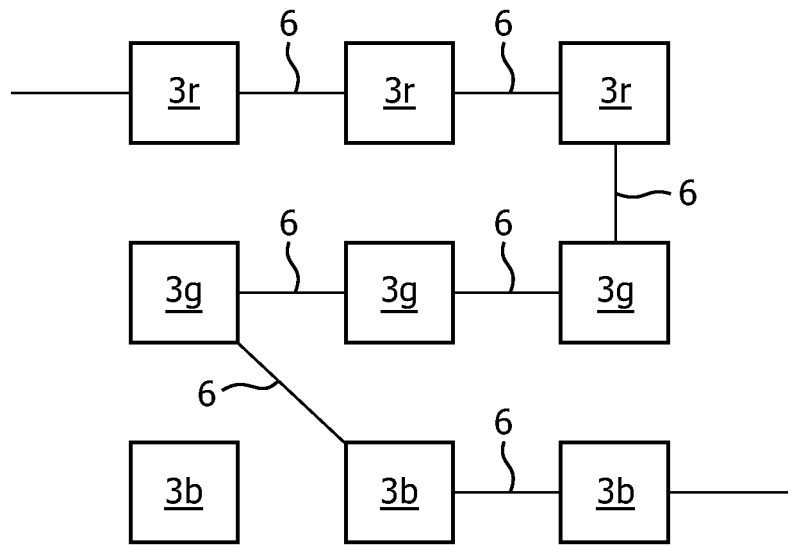

FIG. 4 shows two embodiments nine electroluminescent layer stacks 3 connected in series applying different pattern of the conductive bridges 6. The nine electroluminescent layer stacks emit light of different colors when a driving voltage is applied to the OLED device. In the example shown in FIG. 4, the nine electroluminescent layer stacks comprise three red-emitting electroluminescent layer stacks 3r; three green-emitting electroluminescent layers stacks 3g, and three blue-emitting electroluminescent layer stacks 3b to provide light with an overall white color. In FIG. 4a, all nine electroluminescent layer stacks 3r, 3g, 3b are connected in series by applying a first cover lid with pattern of conductive paths leading to the connection as indicated providing white light of a certain color point. In FIG. 4b, only eight electroluminescent layer stacks 3r, 3g, 3b are connected in series by applying a second cover lid with pattern of conductive paths leading to the connection as indicated with one blue electroluminescent layer stack being not connected (not emitting light) providing white light of a different color point. Since the one blue element is not emitting, the overall color of the OLED device as indicated in FIG. 4b will be shifted to the red spectral range compared to the OLED device as indicated in FIG. 4a. This example shall indicate how the light emission performance can be influenced by applying the identical arrangement of electroluminescent layer stacks on top of a substrate, but only varying the pattern of the conductive paths of the cover lid. In other embodiments, there might be some of the present electroluminescent layer stacks connected in parallel, while the other electroluminescent layer stack might be connected in series. People skilled in the art will find alternative lay-outs for the pattern of the conductive paths of the cover lids within the scope of this invention.

Figure 5:
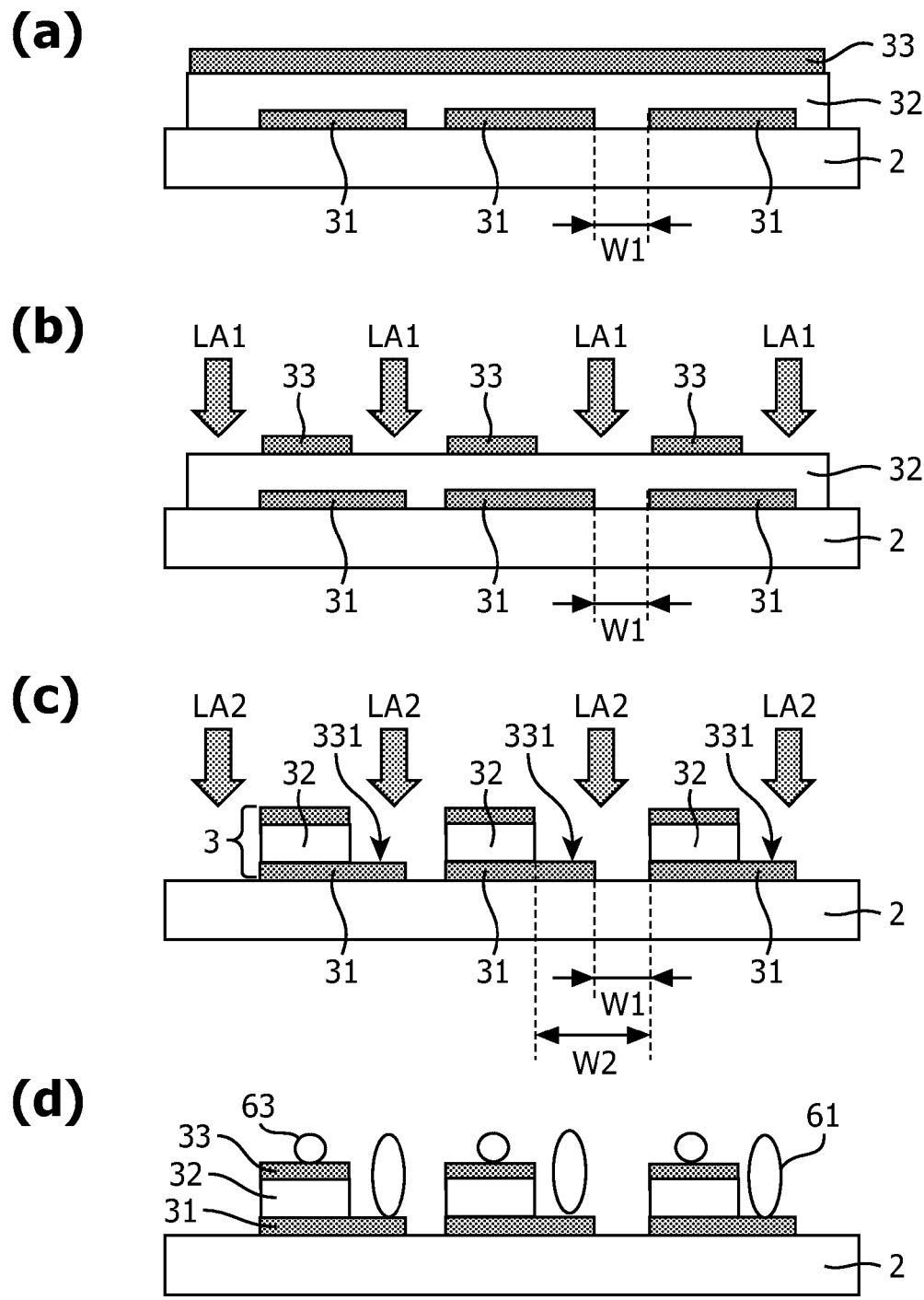
FIG. 5 shows the process steps for manufacturing the organic electroluminescent device according to the present invention.

FIG. 5 shows the process steps for manufacturing the organic electroluminescent device according to the present invention. As a first step (a) the substrate 2 covered with a pattern of the first electrodes 31 separated by a first gap G1 having a first width W1 between adjacent first electrodes 31 to electrically insulate the first electrodes 31 against each other is provided for the following process steps. The patterning of an electrode layer 31 on top of the substrate 2 is known for skilled people. As an example, the first electrode 31 might be made of ITO. The pattern is achieved by a mask process or by an etching process. On top of this substrate with pattern of the first electrodes 31, the organic light emitting layer stack 32 is deposited as a contiguous layer stack on top of the pattern of the first electrodes 31. The organic light emitting layer will also fill the first gap between the first electrodes 31. Suitable deposition processes are vacuum evaporation or printing process (non-vacuum process). On top of the organic light emitting layer stack 32 the second electrode 33 is deposited also as a contiguous layer, e.g. with processes like CVD or sputtering to obtain a layer stack as shown in FIG. 5a. The multiple electroluminescent layer stacks separated against each other are achieved by removing the second electrode 33 and the organic light emitting layer stack 32 above the first gap G1 between the first electrode 31 providing a second gap G2 above the first gap G1 with a second width W2 larger than the first width W2 in order to provide non-covered contacting areas 311 of the first electrodes 31, preferably also removing any material deposited within the first gap G1. This removal is done by laser ablation LA1, LA2 in a two-step process as indicated in FIGS. 5b and 5c. Here the second electrode 33 is structured first by removing the material in the second gap with a first set of laser parameters. Subsequently in a second step the organic light emitting layer stack 32 is structured by removing the material in the second gap with a second set of laser parameters. In some embodiments, first and second set of laser parameter might be the same set of parameters. For example laser parameters might be wavelength, laser pulse length, pulse amplitude, speed of laser focus moving along the to-be-ablated areas, focus area etc. After obtaining the individual electroluminescent layer stacks, the first and second electrical connections 61, 63 are deposited on top of the non-covered contact area 311 of the first electrode 31 and on top of the second electrode 33. The preferred deposition technique is printing, since printing allows applying the conductive material fast and variable for different desired lay-outs of serial connections.

The following steps of encapsulating the electroluminescent layer stacks 3 with a cover lid 4 comprising conductive paths 62 sealed to the substrate 2 providing a gap 5 between the electroluminescent layer stacks 3 and an inner side 41 of the cover lid 4, and establishing conductive bridges 6 between the first electrode 31 of each of the electroluminescent layer stacks 3 involved in the serial connection to the second electrode 33 of another electroluminescent layer stack 3 involved in the serial connection, preferably the adjacent electroluminescent layer stack 3, by connecting the first and second electrical connections 61, 63 to the conductive paths 62 arranged at the inner side 41 of the cover lid 4 suitable for providing a serial connection of the electroluminescent layer stacks 3, to finish the manufacturing of the OLED device are not shown here. The conductive paths 62 at the cover lid 4 may be adapted to a pattern suitable to connect the electroluminescent layer stacks 3 in series with a sequence adapted to the desired application.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

LIST OF REFERENCE SIGNS 1 organic electroluminescent device
2 substrate
3 electroluminescent layer stack
3r, 3g, 3b red/green/blue emitting electroluminescent layer stack
31 first electrode
311 non-covered contacting area of first electrode
32 organic light emitting layer stack
33 second electrode
4 cover lid
41 inner side of the cover lid
42 electrically conductive cover layer (embodiment of a conductive path 62)
43 insulating layer
44 sealing material
5 gap between cover lid and electroluminescent layer stacks
6 conductive bridge
61 first electrical connection
62 conductive path
63 second electrical connection
7 functional component
8 electrical feedthrough
G1 first gap
G2 second gap
W1 first width (width of first gap)
W2 second width (width of second gap)
L entire length of the non-coated area of the first electrode
LA1, LA2 laser ablation

The invention claimed is:

1. A method to provide an organic electroluminescent device, the method comprising the steps of
providing a substrate covered with a pattern of the first electrodes separated by a first gap having a first width between adjacent first electrodes to electrically insulate the first electrodes against each other,
depositing the organic light emitting layer stack as a contiguous layer stack on top of the pattern of the first electrodes,
depositing the second electrode as a contiguous layer on top of the organic light emitting layer stack,
removing the second electrode and the organic light emitting layer stack above the first gap between the first electrode providing a second gap above the first gap with a second width larger than the first width in order to provide non-covered contacting areas of the first electrodes
depositing a first electrical connection on top of the first electrode and depositing a second electrical connection on top of the second electrode,
encapsulating the electroluminescent layer stacks with a cover lid comprising conductive paths sealed to the substrate providing a gap between the electroluminescent layer stacks (3) and an inner side of the cover lid, and
establishing a conductive bridge between the first electrode of at least one electroluminescent layer stack, involved in the serial connection to the second electrode of another electroluminescent layer stack involved in the serial connection by connecting the first and second electrical connections to the conductive paths arranged at the inner side of the cover lid suitable for providing a serial connection of the electroluminescent layer stacks.

2. The method according to claim 1, wherein the step of removing is done by laser ablation.

3. The method according to claim 1, wherein the method further comprises the step of providing the conductive paths at the cover lid in a pattern suitable to connect the electroluminescent layer stacks in series with a sequence adapted to a desired application.

4. The method according to claim 1, further comprising the step of connecting at least one of the first or second electrodes to at least one electrical feedthrough present in the cover lid by depositing an electrical conductive material on top of at least one of the first or second electrodes to provide a driving voltage to at least one of the first or second electrodes.

5. The method according to claim 1, wherein the step of removing is done by plasma etching.

6. The method according to claim 1, wherein the step of removing is done by mechanical removal via an adhesive tape.

* * * * *